United States Patent [19]

Shimanek et al.

[11] 4,039,956
[45] Aug. 2, 1977

[54] ELECTRONIC INDICATOR

[75] Inventors: Ronald W. Shimanek; Mark A. Franklin, both of Kokomo, Ind.

[73] Assignee: General Motors Corporation, Detroit, Mich.

[21] Appl. No.: 610,538

[22] Filed: Sept. 5, 1975

[51] Int. Cl.² .......................... H03J 3/14; H04B 1/16
[52] U.S. Cl. .............................. 325/455; 116/124.1 R; 116/DIG. 29; 324/78 Q; 324/96; 334/86; 340/324 R
[58] Field of Search ............... 325/455, 398; 324/78 J, 324/78 Q, 122, 96; 334/36, 37, 86; 116/124.1 R, 124.4, DIG. 29, DIG. 30, DIG. 31; 340/324 R, 166 EL

[56] References Cited

U.S. PATENT DOCUMENTS

| 3,365,669 | 1/1968 | Funaki et al. | 334/36 |
| 3,673,499 | 6/1972 | Avins et al. | 325/398 |
| 3,732,498 | 5/1973 | Beckman et al. | 325/398 |
| 3,795,863 | 3/1974 | Umeda et al. | 340/324 R |
| 3,796,951 | 3/1974 | Joseph | 340/324 R |
| 3,882,399 | 5/1975 | Karpowycz et al. | 325/455 |
| 3,895,301 | 7/1975 | Kazuo et al. | 325/455 |
| 3,896,386 | 7/1975 | Ohsawa | 325/455 |
| 3,987,392 | 10/1976 | Kugelmann | 340/324 R |

OTHER PUBLICATIONS

"Sensitive F-M Tuning Indicator" — J. Skingley — June 1974, Wireless World, vol. 80, No. 1462, pp. 173–174.

Primary Examiner—Benedict V. Safourek
Assistant Examiner—Marc E. Bookbinder
Attorney, Agent, or Firm—Albert F. Duke

[57] ABSTRACT

An electronic frequency indicator for an AM/FM receiver utilizing a plurality of light-emitting diodes. The intensity of the diodes is varied to achieve greater resolution for the number of diodes in the indicator.

3 Claims, 6 Drawing Figures

ELECTRONIC INDICATOR

This invention relates to solid state electronic indicator devices and more particularly to an electronic dial indicator for AM and FM receivers.

Prior art solid state indicator devices include a plurality of light emitting diodes (LED) positioned on a circuit board located behind a dial or scale of the device. The number of diodes required depends on the scale gradations or the resolution desired. The LEDs are usually successively energized to provide a bar graph or thermometer-like display indicating the value of a monitored variable.

In accordance with the present invention an improved solid state indicator for a radio receiver is provided which utilizes an array of LEDs in place of the conventional pointer for indicating the frequency to which the receiver is tuned. In one embodiment of the invention the LEDs are energized in a manner to permit a bar-type display that moves across the tuning dial as the frequency is changed. Succeeding individual LEDs gradually vary in brightness as the frequency changes, reaching full brightness when the frequency selected corresponds to the LED's position relative to the dial. Previously energized LEDs maintain full brightness. In another embodiment only one LED is energized at any given time and its brightness is varied from a minimum to a maximum and then back to a minimum as the frequency is varied over the range at which the LED is positioned, such as for example, 2 MHz. As the frequency is varied across the radio band, successive individual LEDs are energized and the previously energized LED is deenergized. A third embodiment combines features of the other two embodiments by energizing a maximum of three LEDs at any one time. As the frequency at which an LED is positioned is approached, the center LED is brightest while the one preceding it grows dimmer and the one succeeding it begins to grow brighter.

A more complete understanding of the present invention may be had in the following detailed description which should be read in conjunction with the drawings in which.

Figure 1:
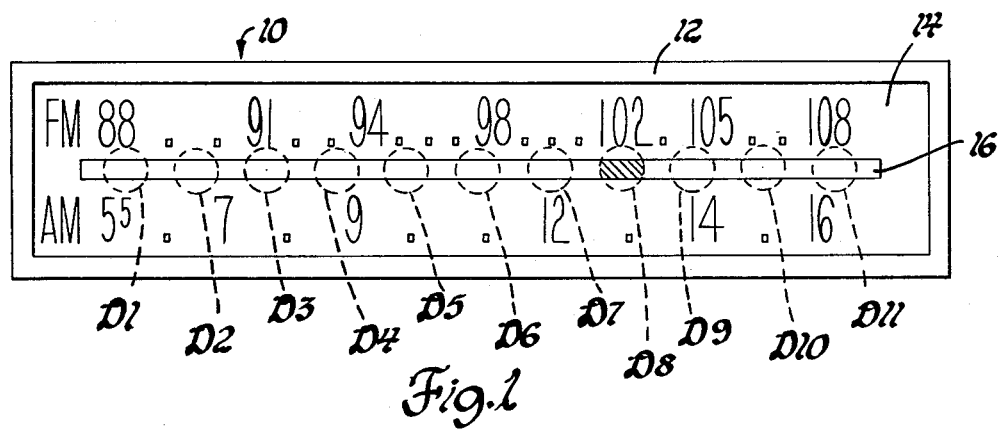
FIG. 1 is a front view of a radio dial plate and showing the physical location of an array of light emitting diodes relative to the dial plate.

Referring now to the drawings and initially to FIG. 1, the numeral 10 generally designates the frequency indicator for an AM/FM receiver. The indicator includes a cover 12 and a scale 14 containing a slot 16. A plurality of light emitting diodes D1-D11 are mounted on a circuit board, not shown, and positioned behind the slot 16 extending over the FM band of 88 MHz. to 108 MHz. in 2 MHz. increments and over the AM band of 550 KHz. to 1600 KHz. in approximately 100 KHz. increments.

Figure 2:
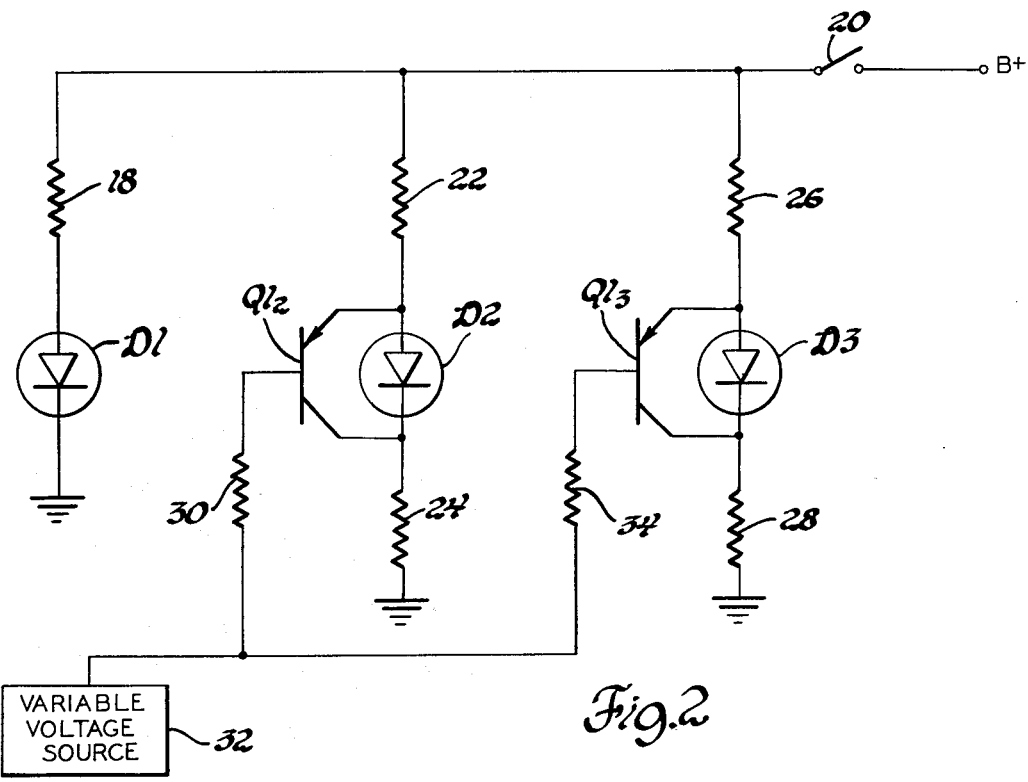
FIG. 2 is a circuit diagram of a first embodiment of the invention.

Referring now to FIG. 2, circuitry for controlling the energization of the LEDs D1-D11 in accordance with one embodiment of the invention is shown. Only three of the eleven LEDs, namely, D1, D2 and D3 are shown in FIG. 2. The LED D1 is connected between B+ and ground through a resistor 18 and On/Off switch 20. The value of the resistor 18 is selected so that the LED D1 is energized to full brilliance as long as the radio On/Off switch 20 is closed. The LED D2 is connected between voltage divider resistors 22 and 24. Similarly, LED D3 is interposed between voltage divider resistors 26 and 28. PNP transistor $Q1_2$ has its emitter electrode connected to a junction between the anode of LED D2 and resistor 22 and its collector connected to a junction between the cathode of LED D2 and resistor 24. The base electrode of $Q1_2$ is connected through a current limiting resistor 30 to a variable voltage source 32. The source 32 may be the source usually provided for varying the voltage across a varactor diode for controlling the tuning of the receiver. With a mechanically tuned receiver the frequency of the local oscillator may be converted directly to a linear tuning voltage by means of a frequency-to-voltage converter which can be used as the source 32. A transistor $Q1_3$ has its emitter connected to a junction between the anode of LED D3 and the resistor 26 and its collector connected to a junction between the cathode of LED D3 and the resistor 28. The base of transistor $Q1_3$ is connected with the source 32 through a current limiting resistor 34. It will be understood that the remaining LEDs D4-D11 are connected to B+ in the same fashion as the LEDs D1-D3.

Figure 2A:
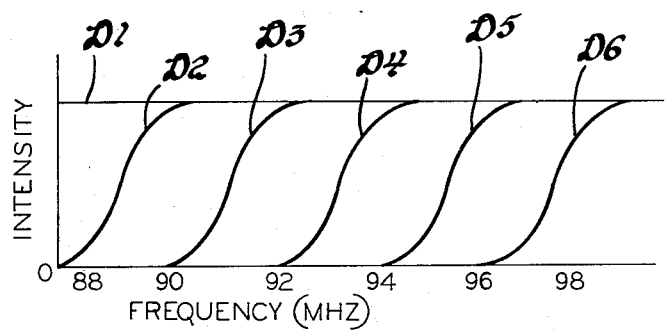
FIG. 2a is a waveform useful in illustrating the operation of the embodiment shown in FIG. 2.

Typical values for the resistors shown in FIG. 2 are as follows: Resistor 18=560 ohms, resistor 22=510 ohms, resistor 24=50 ohms, resistor 26=460 ohms, and resistor 28=100 ohms. With a nominal B+ voltage of 8 volts a current of 10 milliamps flows through the LED D1 to produce full brilliance. LEDs D1-D11 each drop approximately 2½ volts. As the receiver is tuned over the AM or FM band the output of the source 32 preferably varies from a voltage of 1.8 volts to 7.5 volts. Accordingly, when the radio is tuned to the low end of the AM or FM band so that the output of the source 32 is 1.8 volts, the transistors $Q1_2$, $Q1_3$, etc., for each of the LEDs D2-D11 will be forward biased to saturation. Consequently, as shown in FIG. 2a, only the LED D1 will be energized and will be at full brilliance. As the voltage of the source 32 is increased, current flow through the transistor $Q1_2$ decreases and current flow through the LED D2 increases as shown in FIG. 2a so that at approximately 90 MHz. on the FM dial and 650 KHz. on the AM dial both the LEDS D1 and D2 are at full brilliance. After the LED D2 reaches full brilliance a continuation of the increase of voltage from the source 32 will cause current to diminish through the transistor $Q1_3$ and cause an increase of current through the LED D3 until at approximately 92 MHz. on the FM dial and 750 KHz. on the AM dial the LED D3 reaches full brilliance. Succeeding LEDs will be energized from a minimum to a maximum brilliance while the previous LEDs are maintained at full brilliance as the voltage of the source 32 is increased until at a voltage of approximately 7.5 volts or at the upper end of the AM and FM band all of the LEDs D1-D11 will be energized at full brilliance.

Figure 3:
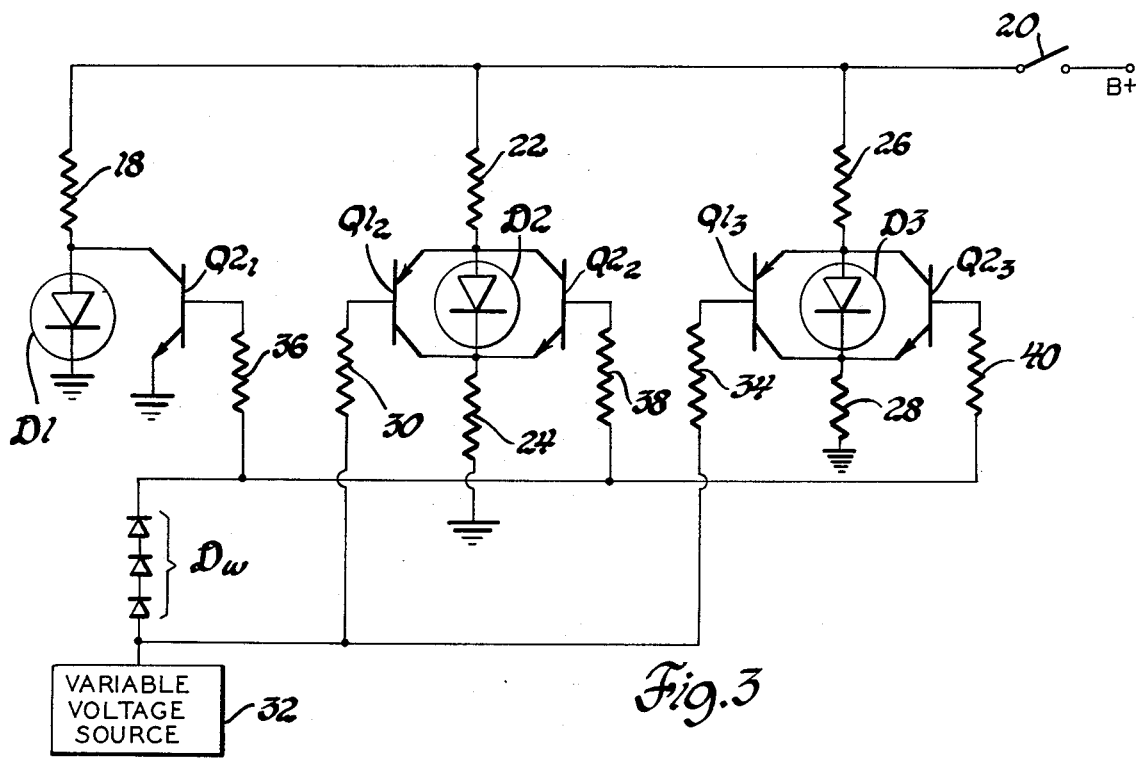
FIG. 3 is a circuit diagram of another embodiment of the invention.

Referring now to FIG. 3 components which are identical with those previously discussed in FIG. 2 are designated by identical reference numerals. In FIG. 3, NPN transistors $Q2_1$, $Q2_2$, and $Q2_3$ have been added. Each of the NPN transistors has its emitter-collector electrodes connected in parallel with the LEDS D1, D2 and D3, respectively. The base of each of the NPN transistors is connected with the source 32 through a string of diodes collectively designated $D_w$ and individual current limiting resistors 36, 38 and 40, respectively.

Figure 3A:
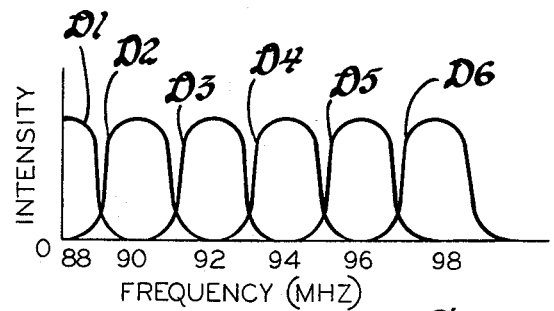
FIGS. 3a and 3b are waveforms showing two different modes of operation of the circuitry shown in FIG. 3 depending on the indicator width desired.
Figure 3B:
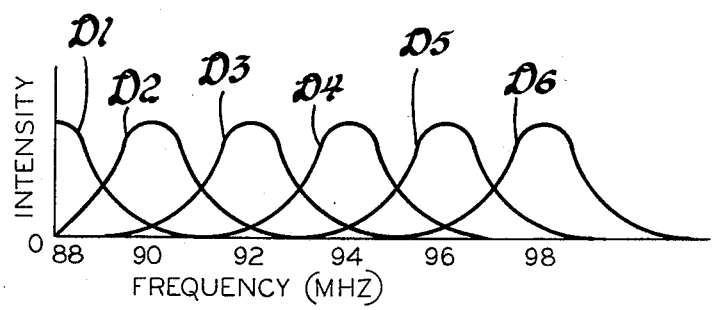

The operation of the circuit shown in FIG. 3 will be explained with reference to FIGS. 3a and 3b. Referring first to FIG. 3a; with the voltage source 32 at 1.8 volts the LED D1 is at full brilliance and the transistors $Q1_2$, $Q1_3$ are in saturation so that no current flows through the LEDS D2 and D3, the NPN transistors $Q2_1$, $Q2_2$, $Q2_3$ are cut off. As the voltage of the source 32 increases, current flow through the PNP transistor $Q1_2$ will decrease and current flow through the LED D2 will increase. Depending upon the number of diodes in the string $D_w$, at a particular voltage of the source 32 the transistor $Q2_1$ begins to conduct and shunt current from the LED D1. Thereafter, as shown in FIG. 3a, the transistor $Q1_2$ begins to turn off and current flow through the LED D2 begins to increase. After the LED D2 reaches full brilliance the transistor $Q2_2$ begins to conduct and shunt current away from the LED D2. Similarly, at some voltage after $Q2_2$ begins conduction, $Q1_3$ begins to turn off and current flows through the LED D3. After the LED D3 reaches full brilliance the transistor $Q2_3$ begins to turn on and shunt current away from the LED D3. Consequently, the LED D1 is varied from maximum brilliance to minimum brilliance or no light output while the LEDS D2 and D3 are varied from minimum or no light output to maximum and back to minimum brilliance. It will be understood, of course, that the LED D1 could also be varied in the same manner as the LEDs D2 and D3 if such is desired.

By increasing the number of diodes in the diode string $D_w$, the number of LEDs which are energized at any one time may be increased. For example, as shown in FIG. 3b, all three of the LEDs D1, D2 and D3 are at some intensity level between minimum and maximum at a particular voltage or frequency. For example, at 90 MHz. the LEDs D1 and D3 are approximately one-quarter brilliance while the LED D2 is at maximum brilliance. Thus, as the frequency at which an LED is positioned is approached, that LED is brightest while the brightness of the preceding LED diminishes and the brightness of the succeeding LED increases.

It will be apparent from the above that we have provided an improved electronic indicator which reduces the number of light emitting diodes necessary to achieve a predetermined degree of resolution by varying the intensity of the light emitted from the diode over a predetermined range of the variable being monitored.

Having thus described our invention what we claim is:

1. An electronic indicator circuit comprising a plurality of parallel connected light emitting diodes, a variable DC voltage source, a source of regulated DC voltage, voltage divider means connecting each of said diodes to said regulated source and establishing a reference voltage at one terminal of each of said diodes, transistor means connected in circuit with respective ones of said diodes and responsive to the voltage established at said terminal and to said variable DC voltage source for continuously varying the current through each of said diodes over a range from a minimum to a maximum level in sequence as said variable DC voltage source is varied over a predetermined voltage range whereby each diode is successively activated and previously energized diodes remain activated.

2. An electronic frequency indicator for a radio frequency receiver having a dial plate comprising a plurality of light emitting diodes distributed across the dial plate at desired frequency increments, means providing a variable DC voltage which varies with frequency, a source of regulated DC voltage, voltage divider means connecting each of said diodes to said regulated source and establishing a different voltage at one terminal of each diode, first and second transistor means of opposite conductivity type connected in circuit with each of said diodes and responsive to the voltage established at said terminal and to said variable DC voltage for varying the current through each of said diodes from a minimum to a maximum and back to a minimum level corresponding to a range of frequencies whereby only one diode is activated at any time but successive individual diodes are activated and previously activated diodes are deactivated as the frequency is varied.

3. An electronic frequency indicator for a radio frequency receiver having a dial plate comprising a plurality of light emitting diodes distributed across the dial plate at desired frequency increments, means providing a variable DC voltage which varies with frequency, a source of regulated DC voltage, voltage divider means connecting each of said diodes to said regulated source and establishing a different voltage at one terminal at each diode, the voltage at the diode located at successively higher frequencies being a higher voltage, first and second transistors of opposite conductivity type connected in shunt with each of said diodes and responsive to the voltage established at said terminal and said variable DC voltage for varying the current through each of said diodes from a minimum to a maximum and back to a minimum level corresponding to a frequency range from a lower frequency to a higher frequency, voltage dropping means connected in circuit with each of said second transistors whereby a plurality of light emitting diodes are activated at any one time.

* * * * *